United States Patent
Rofougaran (10) Patent No.: US 7,684,767 B2
(45) Date of Patent: Mar. 23, 2010

(54) VOICE, DATA AND RF INTEGRATED CIRCUIT WITH MULTIPLE MODULATION MODES AND METHODS FOR USE THEREWITH

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 538 days.

(21) Appl. No.: 11/710,746

(22) Filed: Feb. 26, 2007

(65) Prior Publication Data

US 2008/0207148 A1 Aug. 28, 2008

(51) Int. Cl.
H04B 1/02 (2006.01)
H01Q 11/12 (2006.01)
H04Q 1/04 (2006.01)

(52) U.S. Cl. .................. 455/91; 455/102; 455/127.1; 375/295

(58) Field of Classification Search .............. 455/91, 455/102, 114.2–114.3, 115.1, 126–127.5; 375/295–297
See application file for complete search history.

(56) References Cited

U.S. PATENT DOCUMENTS

| | | | |
|---|---|---|---|
| 5,432,473 A * | 7/1995 | Mattila et al. | 330/133 |
| 6,256,482 B1 * | 7/2001 | Raab | 455/108 |
| 6,304,139 B1 * | 10/2001 | Kanno | 330/133 |
| 6,580,901 B1 * | 6/2003 | Mochizuki | 455/127.1 |
| 6,653,909 B2 * | 11/2003 | Nielsen | 332/151 |
| 6,721,368 B1 * | 4/2004 | Younis et al. | 375/295 |
| 7,072,626 B2 * | 7/2006 | Hadjichristos | 455/126 |
| 7,082,290 B2 * | 7/2006 | Takano et al. | 455/102 |
| 7,092,686 B2 * | 8/2006 | Amanullah et al. | 455/127.1 |
| 7,116,947 B2 * | 10/2006 | Tanabe et al. | 455/91 |
| 7,236,542 B2 * | 6/2007 | Matero | 375/295 |
| 7,477,102 B1 * | 1/2009 | Ellis et al. | 330/133 |
| 7,526,261 B2 * | 4/2009 | Sorrells et al. | 455/127.3 |
| 2004/0023620 A1 * | 2/2004 | Sahota et al. | 455/91 |
| 2007/0082630 A1 * | 4/2007 | Aridas et al. | 455/127.2 |
| 2008/0081572 A1 * | 4/2008 | Rofougaran | 455/127.1 |

* cited by examiner

Primary Examiner—Simon D Nguyen
(74) Attorney, Agent, or Firm—Garlick Harrison & Markison; Bruce E. Stuckman (57) ABSTRACT

A voice data and RF integrated circuit (IC) includes a driver that generates an RF signal to a power amplifier module from an up-converted signal. A modulation controller provides a first modulation signal to the driver for modulating the up-converted signal when a modulation control signal has a first value and provides a second modulation signal to the power amplifier module for modulating the RF signal when the modulation control signal has a second value.

21 Claims, 9 Drawing Sheets

VOICE, DATA AND RF INTEGRATED CIRCUIT WITH MULTIPLE MODULATION MODES AND METHODS FOR USE THEREWITH

BACKGROUND OF THE INVENTION

1. Technical Field of the Invention

This invention relates generally to mobile communication devices and more particularly to a circuit for managing power in a combined voice, data and RF integrated circuit.

2. Description of Related Art

Communication systems are known to support wireless and wire line communications between wireless and/or wire line communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna through an antenna interface and includes a low noise amplifier, one or more intermediate frequency stages, a filtering stage, and a data recovery stage. The low noise amplifier (LNA) receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

RF transmitters can generate polar coordinate transmissions that are simultaneously amplitude modulated and phase modulated to carry more data over a single transmitted signal. The can be performed in two phases with phase modulation occurring first in a phase locked loop and amplitude modulation being induced on the phase modulated signal by the power amplifier. While a flexible approach, the power amplifier must respond to a wide range of possible modulating signals. Further limitations and disadvantages of conventional and traditional approaches will become apparent to one of ordinary skill in the art through comparison of such systems with the present invention.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
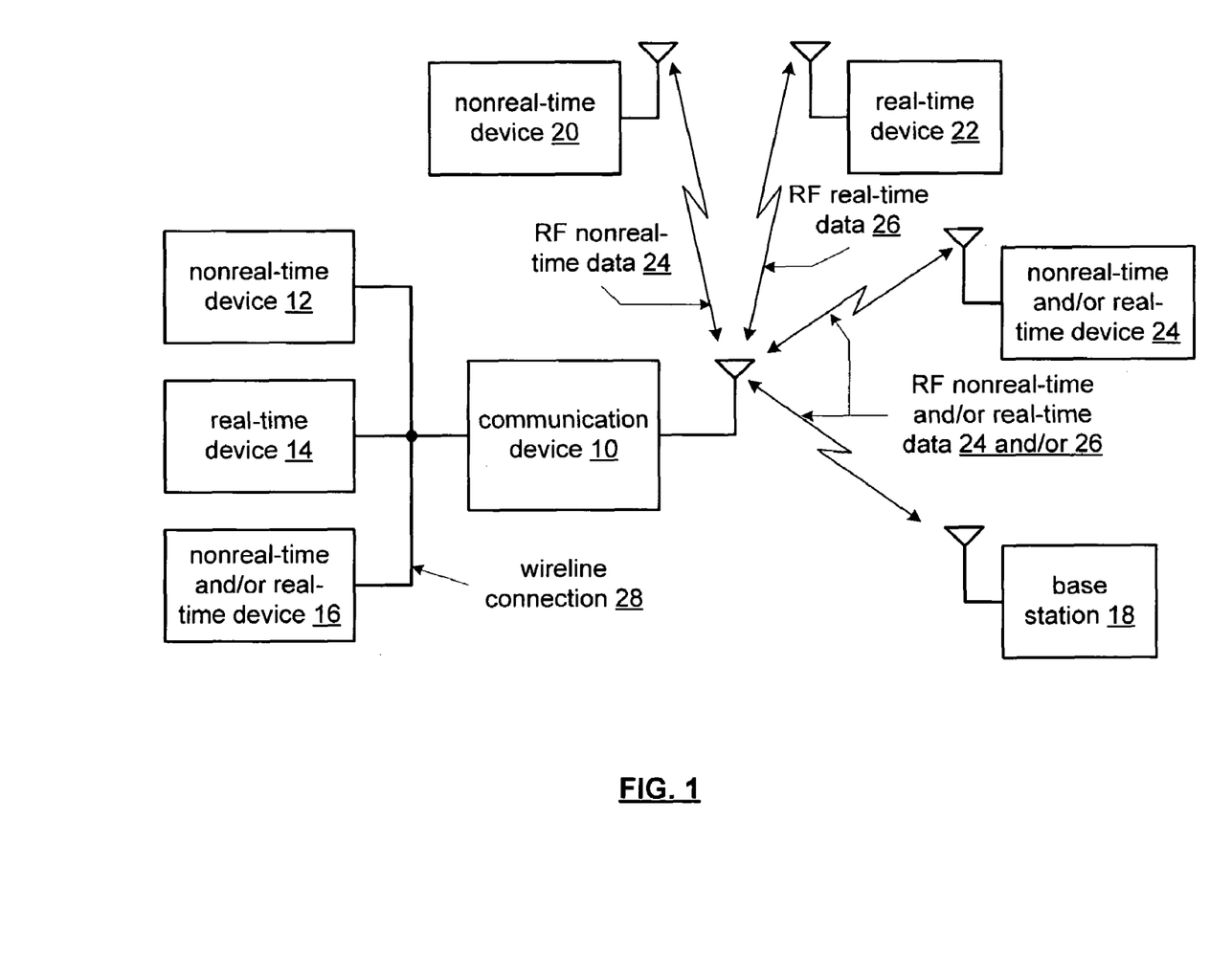
FIG. 1 is a schematic block diagram of an embodiment of a communication system in accordance with the present invention.

FIG. 1 is a schematic block diagram of an embodiment of a communication system in accordance with the present invention. In particular a communication system is shown that includes a communication device 10 that communicates real-time data 24 and non-real-time data 26 wirelessly with one or more other devices such as base station 18, non-real-time device 20, real-time device 22, and non-real-time and/or real-time device 24. In addition, communication device 10 can also optionally communicate over a wireline connection with non-real-time device 12, real-time device 14 and non-real-time and/or real-time device 16.

In an embodiment of the present invention the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as IEEE 802.11, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 10.

Communication device 10 can be a mobile phone such as a cellular telephone, a personal digital assistant, game console, personal computer, laptop computer, or other device that performs one or more functions that include communication of voice and/or data via wireline connection 28 and/or the wireless communication path. In an embodiment of the present invention, the real-time and non-real-time devices 12, 14 16, 18, 20, 22 and 24 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment of the present invention, the communication device 10 includes an integrated circuit, such as a combined voice, data and RF integrated circuit that includes one or more features or functions of the present invention. Such integrated circuits shall be described in greater detail in association with FIGS. 3-9 that follow.

Figure 2:
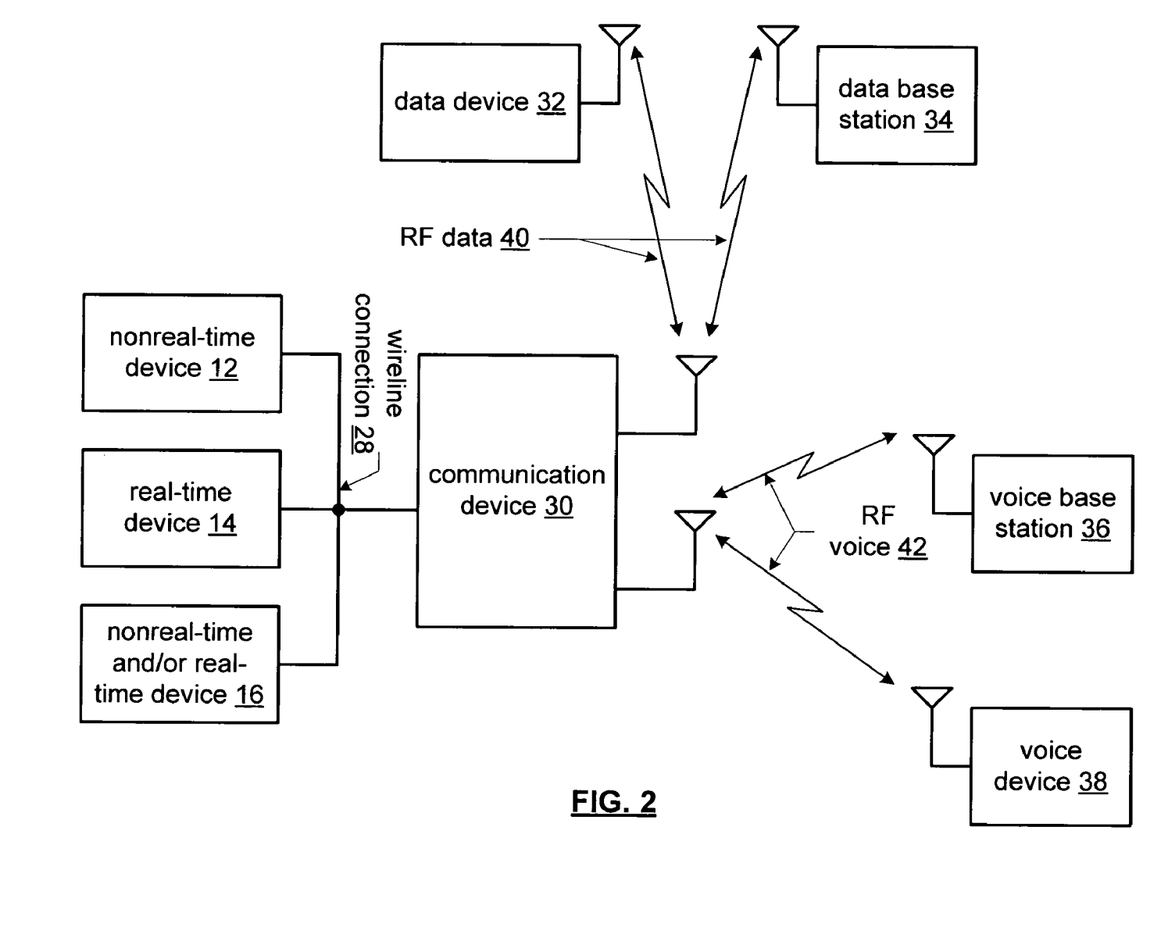
FIG. 2 is a schematic block diagram of an embodiment of another communication system in accordance with the present invention.

FIG. 2 is a schematic block diagram of an embodiment of another communication system in accordance with the present invention. In particular, FIG. 2 presents a communication system that includes many common elements of FIG. 1 that are referred to by common reference numerals. Communication device 30 is similar to communication device 10 and is capable of any of the applications, functions and features attributed to communication device 10, as discussed in conjunction with FIG. 1. However, communication device 30 includes two separate wireless transceivers for communicating, contemporaneously, via two or more wireless communication protocols with data device 32 and/or data base station 34 via RF data 40 and voice base station 36 and/or voice device 38 via RF voice signals 42.

Figure 3:
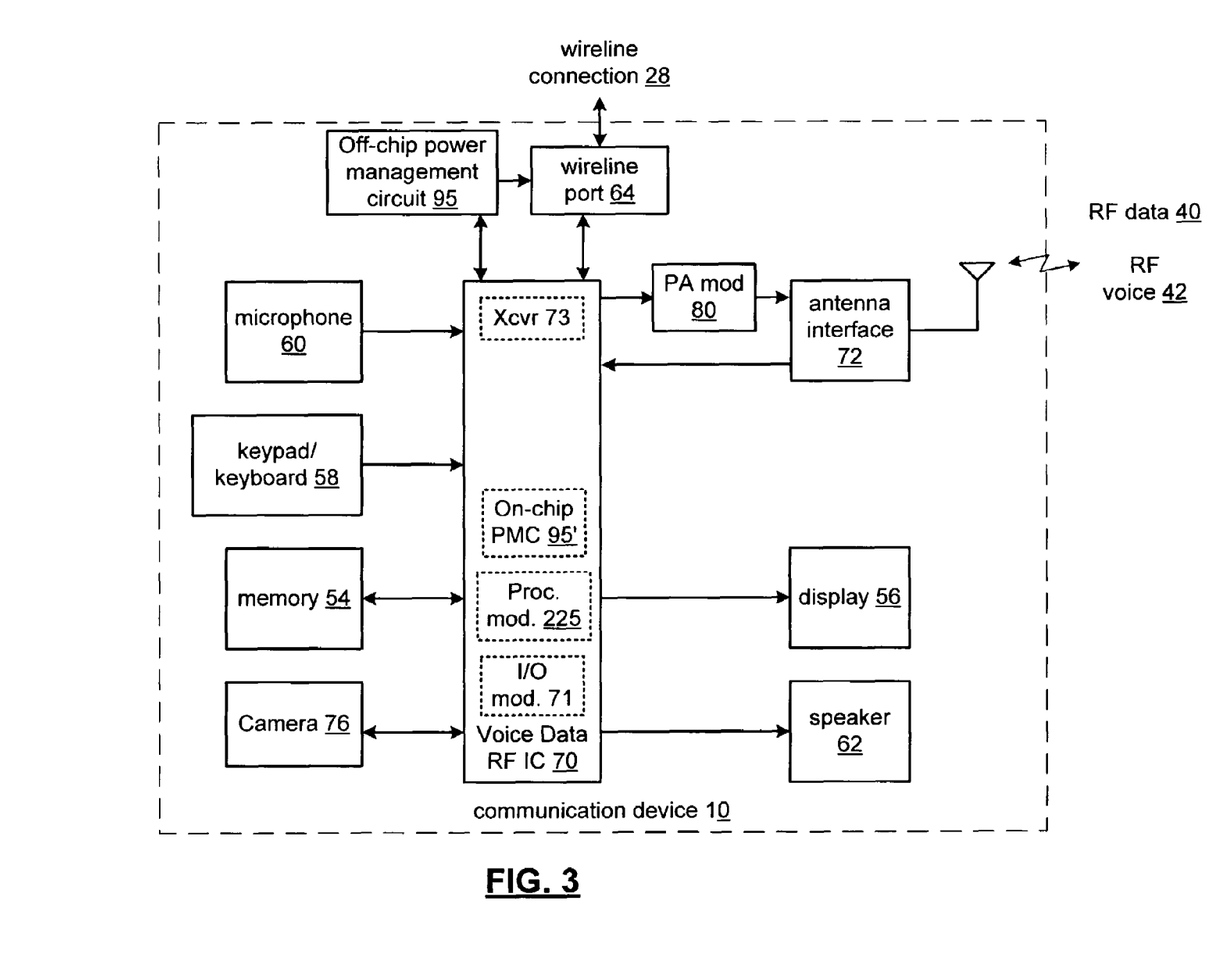
FIG. 3 is a schematic block diagram of an embodiment of an integrated circuit in accordance with the present invention.

FIG. 3 is a schematic block diagram of an embodiment of an integrated circuit in accordance with the present invention. In particular, a voice data RF integrated circuit (IC) 50 is shown that implements communication device 10 in conjunction with microphone 60, keypad/keyboard 58, memory 54, speaker 62, display 56, camera 76, antenna interface 52 and wireline port 64. In addition, voice data RF IC 50 includes a transceiver 73 with RF and baseband modules for formatting and modulating data and voice signals into RF real-time data 26 and non-real-time data 24 and transmitting this data via an off-chip power amplifier module 80 and antenna interface 72 and an antenna, and for receiving RF data and RF voice signals via the antenna. Further, voice data RF IC 50 includes an input/output module 71 with appropriate encoders and decoders for communicating via the wireline connection 28 via wireline port 64, an optional memory interface for communicating with off-chip memory 54, a codec for encoding voice signals from microphone 60 into digital voice signals, a keypad/keyboard interface for generating data from keypad/keyboard 58 in response to the actions of a user, a display driver for driving display 56, such as by rendering a color video signal, text, graphics, or other display data, and an audio driver such as an audio amplifier for driving speaker 62 and one or more other interfaces, such as for interfacing with the camera 76 or the other peripheral devices.

Off-chip power management circuit 95 includes one or more DC-DC converters, voltage regulators, current regulators or other power supplies for supplying the voice data RF IC 50 and optionally the other components of communication device 10 and/or its peripheral devices with supply voltages and or currents (collectively power supply signals) that may be required to power these devices. Off-chip power management circuit 95 can operate from one or more batteries, line power and/or from other power sources, not shown. In particular, off-chip power management module can selectively supply power supply signals of different voltages, currents or current limits or with adjustable voltages, currents or current limits in response to power mode signals received from the voice data RF IC 50. Voice Data RF IC 50 optionally includes an on-chip power management circuit 95' for replacing the off-chip power management circuit 95.

In an embodiment of the present invention, the voice data RF IC 50 is a system on a chip integrated circuit that includes at least one processing device. Such a processing device, for instance, processing module 225, may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip such as memory 54. Such a memory device may be a read-only memory, random access memory, volatile memory, non-volatile memory, static memory, dynamic memory, flash memory, and/or any device that stores digital information. Note that when the Voice Data RF IC 50 implements one or more of its functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

In operation, the voice data RF IC 50 executes operational instructions that implement one or more of the applications (real-time or non-real-time) attributed to communication devices 10 and 30 as discussed in conjunction with FIGS. 1 and 2. Further, RF IC 50 includes modulation control features in accordance with the present invention that will be discussed in greater detail in association with FIG. 5.

Figure 4:
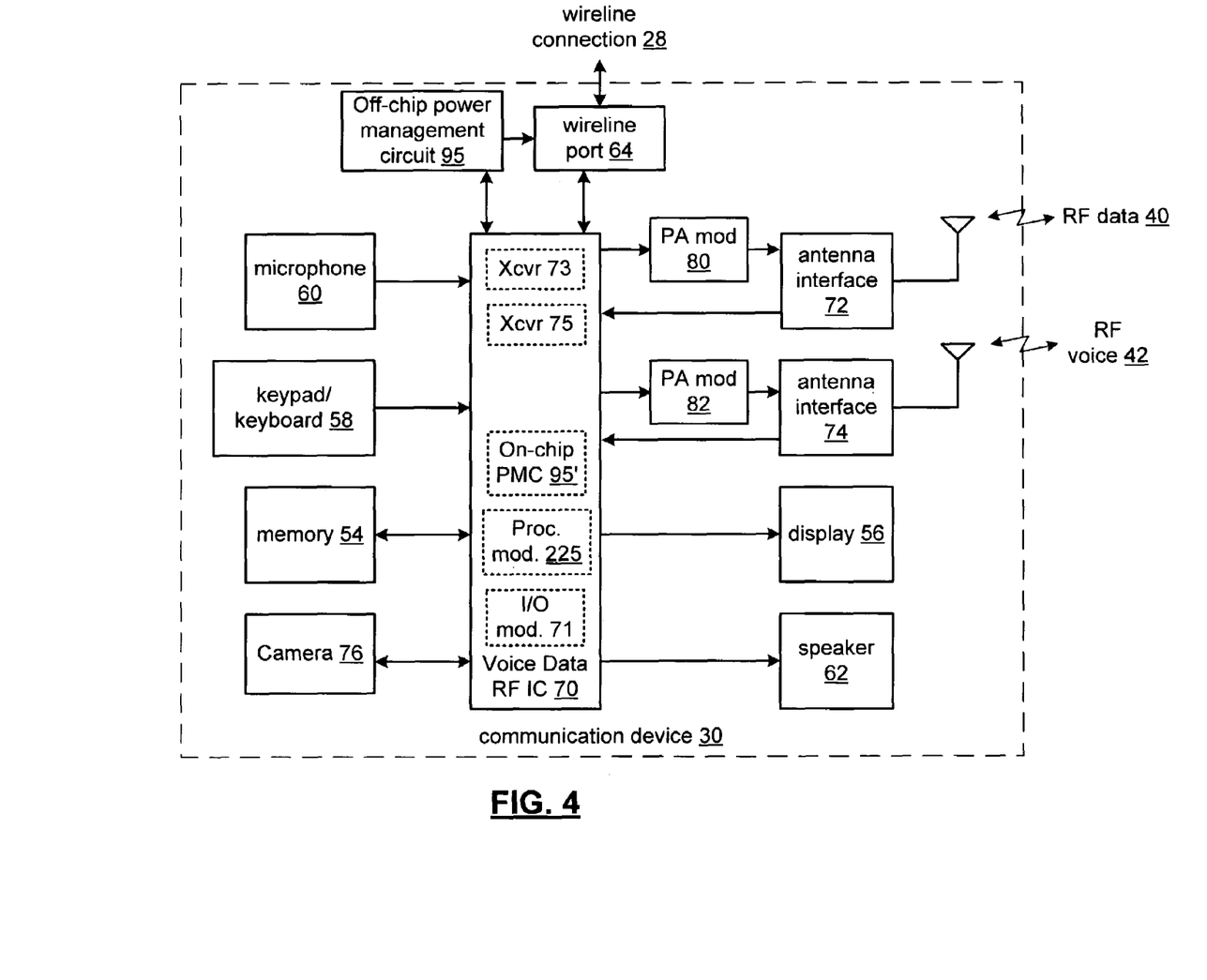
FIG. 4 is a schematic block diagram of another embodiment of an integrated circuit in accordance with the present invention.

FIG. 4 is a schematic block diagram of another embodiment of an integrated circuit in accordance with the present invention. In particular, FIG. 4 presents a communication device 30 that includes many common elements of FIG. 3 that are referred to by common reference numerals. Voice data RF IC 70 is similar to voice data RF IC 50 and is capable of any of the applications, functions and features attributed to voice data RF IC 50 as discussed in conjunction with FIG. 3. However, voice data RF IC 70 includes two separate wireless transceivers 73 and 75 for communicating, contemporaneously, via two or more wireless communication protocols via RF data 40 and RF voice signals 42.

In operation, the voice data RF IC 70 executes operational instructions that implement one or more of the applications (real-time or non-real-time) attributed to communication device 10 as discussed in conjunction with FIG. 1. Further, RF IC 70 includes modulation control features in accordance with the present invention that will be discussed in greater detail in association with FIG. 5.

Figure 5:
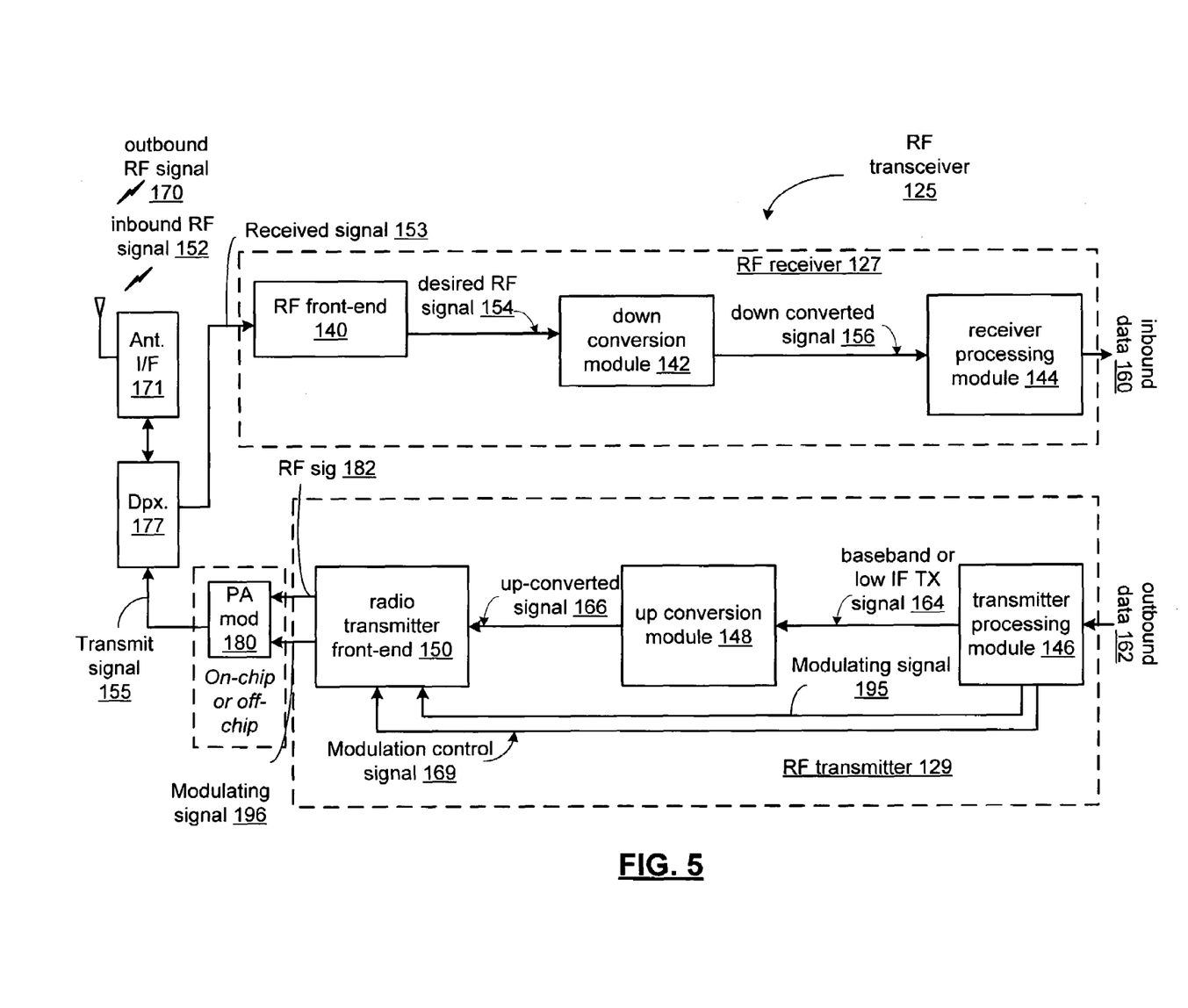
FIG. 5 is a schematic block diagram of an embodiment of an RF transceiver in accordance with the present invention.

FIG. 5 is a schematic block diagram of an RF transceiver 125, such as transceiver 73 or 75, which may be incorporated in communication devices 10 and/or 30. The RF transceiver 125 includes an RF transmitter 129, an RF receiver 127 coupled to the processing module 225. The RF receiver 127 includes an RF front end 140, a down conversion module 142, and a receiver processing module 144. The RF transmitter 129 includes a transmitter processing module 146, an up conversion module 148, a radio transmitter front-end 150, and a power amplifier module 180 that can be implemented off-chip in a design such as off-chip power amplifier module 80 or 82 or on-chip as part of voice, data and RF IC 50 or 70.

As shown, the transmitter is coupled to an antenna through power amplifier module 180, off-chip antenna interface 171 and a diplexer (duplexer) 177, that couples the transmit signal 155 to the antenna to produce outbound RF signal 170 and couples inbound RF signal 152 to produce received signal 153. While a diplexer is shown, a transmit/receive switch could likewise be employed for the same purpose. While a single antenna is represented, the receiver and transmitter may each employ separate antennas or share a multiple antenna structure that includes two or more antennas. In another embodiment, the receiver and transmitter may share a multiple input multiple output (MIMO) antenna structure that includes a plurality of antennas. Each antenna may be fixed, programmable, an antenna array or other antenna configuration. Accordingly, the antenna structure of the wireless transceiver could also depend on the particular standard(s) to which the wireless transceiver is compliant and the applications thereof.

In operation, the transmitter receives outbound data 162 from a host device or other source via the transmitter processing module 146. The transmitter processing module 146 processes the outbound data 162 in accordance with a particular wireless communication standard (e.g., IEEE 802.11, Bluetooth, RFID, GSM, CDMA, et cetera) to produce baseband or low intermediate frequency (IF) transmit (TX) signals 164. The baseband or low IF TX signals 164 may be digital baseband signals (e.g., have a zero IF) or digital low IF signals, where the low IF typically will be in a frequency range of one hundred kilohertz to a few megahertz.

In an embodiment of the present invention, the RF transmitter 129 produces a transmit signal 155 that includes a polar coordinate transmission having a carrier wave that is amplitude modulated and phase modulated by separate modulation signals. In this fashion, a portion of the outbound data 162 can be converted to processed data such as the baseband or low IF transmit signal 164 for phase modulation by up conversion module 148 and the remaining outbound data can be converted into modulating signal 195 for amplitude modulation by either the radio transmitter front-end 150 or the power amplifier module 180.

In an embodiment of the present invention, the RF transmitter is capable of operating in a plurality of different operating modes under control of the transmitter processing module 146. In particular, in one mode, when deep (high percent) amplitude modulation is required, a modulation control signal 169 can be generated having a first value that commands the radio transmitter front-end 150 to produce a modulating signal 196, based on modulating signal 195, for amplitude modulating the RF signal 182 at the power amplifier module 180. In another mode, when lower-level amplitude modulation is required, the modulation control signal 169 can be generated having a second value that commands the radio transmitter front-end 150 to amplitude modulate the up-converted signal 166 via a driver or other modulating element of radio transmitter front-end 150 that operates at lower power than power amplifier module 180. While the modes described above vary the source of modulation based on the depth of the modulation, other criteria, such as modulation bandwidth, modulation format or other variables can likewise be used by transmitter processing module 146 or some other element to generate modulation control signal 169 to command the radio transmitter front-end 150 and power amplifier module 180 to implement the selected mode of operation.

Note that the processing performed by the transmitter processing module 146 can include, but is not limited to, scrambling, encoding, puncturing, mapping, modulation, and/or digital baseband to IF conversion. Further note that the transmitter processing module 146 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 146 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

The up conversion module 148 can includes a digital-to-analog conversion (DAC) module, a filtering and/or gain module, and an up-conversion section. The DAC module converts the baseband or low IF TX signals 164 from the digital domain to the analog domain. The filtering and/or gain module filters and/or adjusts the gain of the analog signals prior to providing it to the up-conversion section. The up-conversion section converts the analog baseband or low IF signals into up converted signals 166 based on a transmitter local oscillation 168. As discussed above, the up conversion module 148 phase modulates an RF carrier frequency based on the processed signal, such as baseband or low IF transmit signal 164, to produce up-converted signal 166. In an embodiment of the present invention a phase locked loop circuit or other phase modulator is used for this purpose. Up conversion module 166 optionally includes a limiter circuit for leveling the amplitude of up-converted signal 166 prior to amplitude modulation by either the radio frequency front end 150 and/or power amplifier module 180.

The radio transmitter front end 150 includes a driver for producing an RF signal 182 that drives power amplifier module 180, and optionally includes a transmit filter module. The power amplifier module 180 amplifies the RF signals 182 to produce transmit signal 155 and ultimately outbound RF signals 170, which may be filtered by the transmitter filter module, if included. The antenna structure transmits the outbound RF signals 170 to a targeted device such as a RF tag, base station, an access point and/or another wireless communication device via an antenna interface 171 coupled to an antenna that provides impedance matching and optional bandpass and/or notch filtration. As discussed above, under control of modulation control signal 169, the radio transmitter front end 150 can modulate the up-converted signal 166 based on the modulating signal 195 and/or the power amplifier module 180 can modulates the RF signal 182 based on the modulating signal 196. Further operation of the radio transmitter front-end 150 and power amplifier module 180 will be discussed in conjunction with FIGS. 6 and 8-9 that follow.

The receiver receives inbound RF signals 152 via the antenna and off-chip antenna interface 171 that operates to process the inbound RF signal 152 into received signal 153 for the receiver front-end 140. In general, antenna interface 171 provides impedance matching of antenna to the RF front-end 140 and optional bandpass and/or notch filtration of the inbound RF signal 152.

The down conversion module 70 includes a mixing section, an analog to digital conversion (ADC) module, and may also include a filtering and/or gain module. The mixing section converts the desired RF signal 154 into a down converted signal 156 that is based on a receiver local oscillation 158, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 156. Note that the ordering of the ADC module and filtering and/or gain module may be switched, such that the filtering and/or gain module is an analog module.

The receiver processing module 144 processes the baseband or low IF signal 156 in accordance with a particular wireless communication standard (e.g., IEEE 802.11, Bluetooth, RFID, GSM, CDMA, et cetera) to produce inbound data 160. The processing performed by the receiver processing module 144 includes, but is not limited to, digital intermediate frequency to baseband conversion, demodulation, demapping, depuncturing, decoding, and/or descrambling. Note that the receiver processing modules 144 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the receiver processing module 144 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Figure 6:
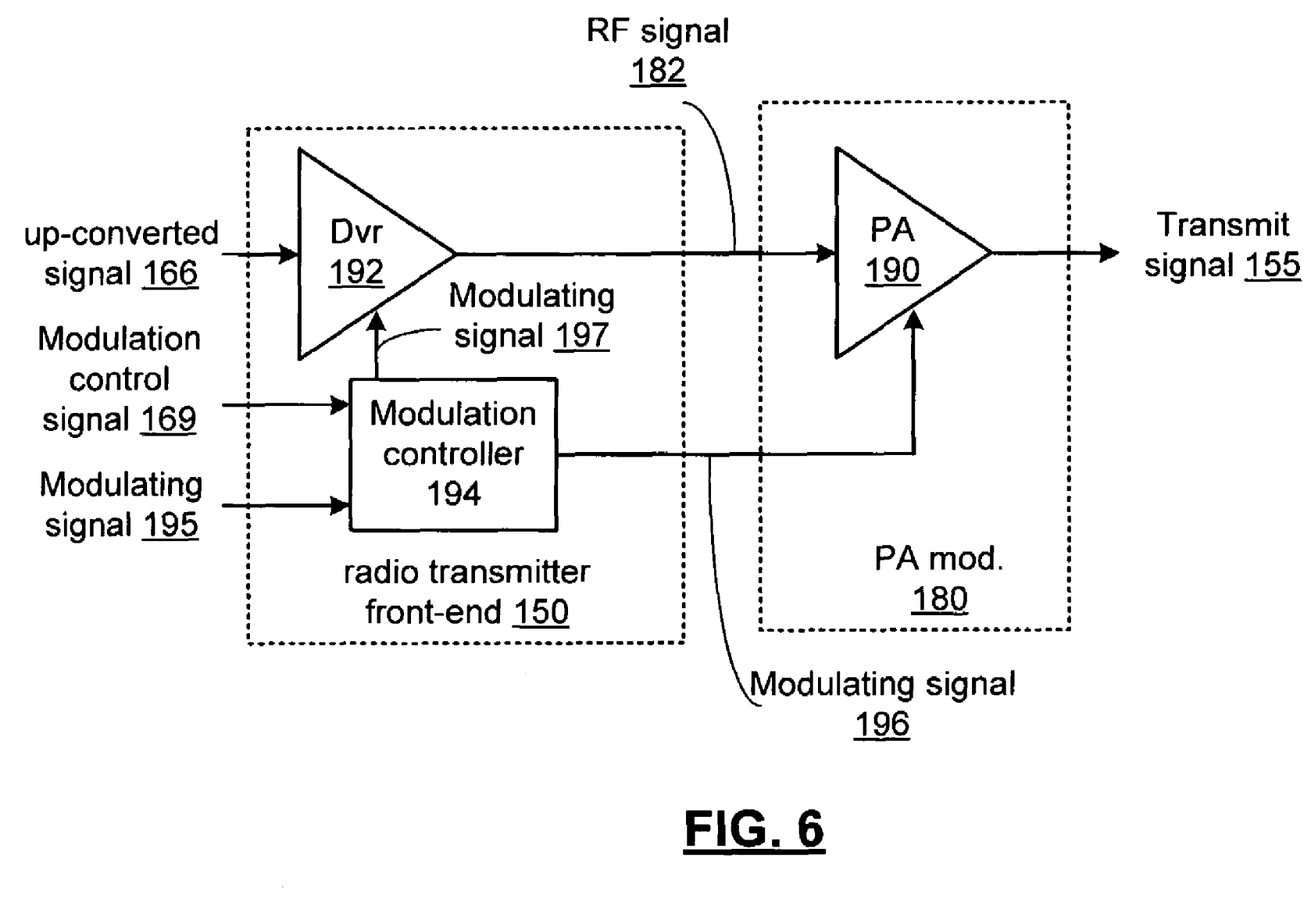
FIG. 6 is a schematic block diagram of an embodiment of a radio transmitter front-end and power amplifier module in accordance with the present invention.

FIG. 6 is a schematic block diagram of an embodiment of a radio transmitter front-end and power amplifier module in accordance with the present invention. In particular, the radio transmitter front-end 150 includes driver 192 that generates RF signal 182 to power amplifier module 180 from up-converted signal 166 and modulation controller 194 that generates modulating signals 197 and/or 196 from modulating signal 195, based on the value of modulation control signal 169. Both driver 192 and power amplifier 190 of power amplifier module 180 are capable of amplitude modulating their respective input signals. In operation, modulation controller 194 provides modulation signal 197 to driver 192 for modulating the up-converted signal 166 when the modulation control signal 169 has a first value and provides modulation signal 196 to power amplifier module 180 for modulating the RF signal 182 when the modulation control signal 169 has a second value. In an embodiment of the present invention, modulation controller is implemented with a switch or switching network that selectively couples modulating signal 195 as either modulating signal 196 or 197 while coupling the other modulating signal (196 or 197) to a ground potential or other signal that causes the respective driver 192 or power amplifier 190 to amplify and not amplitude modulate when modulation is being produced at the other device. In another embodiment, modulation controller 194 produces modulating signals 197 and 196 by scaling the modulating signal 195 to a signal level, either set by modulation control signal under command of transmitter processing module 146 or based on the value of modulation control signal 169 to match the signal levels expected by either driver 192 or power amplifier 190.

In a further embodiment of the present invention, modulation control 194, in response to a third value of modulation control signal 169 can produce modulating signals 197 and 196 so that driver 192 and power amplifier 190 both cooperate to module their respective input signals. In this fashion, driver 192 modulates up-converted signal 166 based on modulating signal 197 and power amplifier 190 amplitude modulates the resulting RF signal 182 by modulating signal 196 to produce transmit signal 155.

Figure 7:
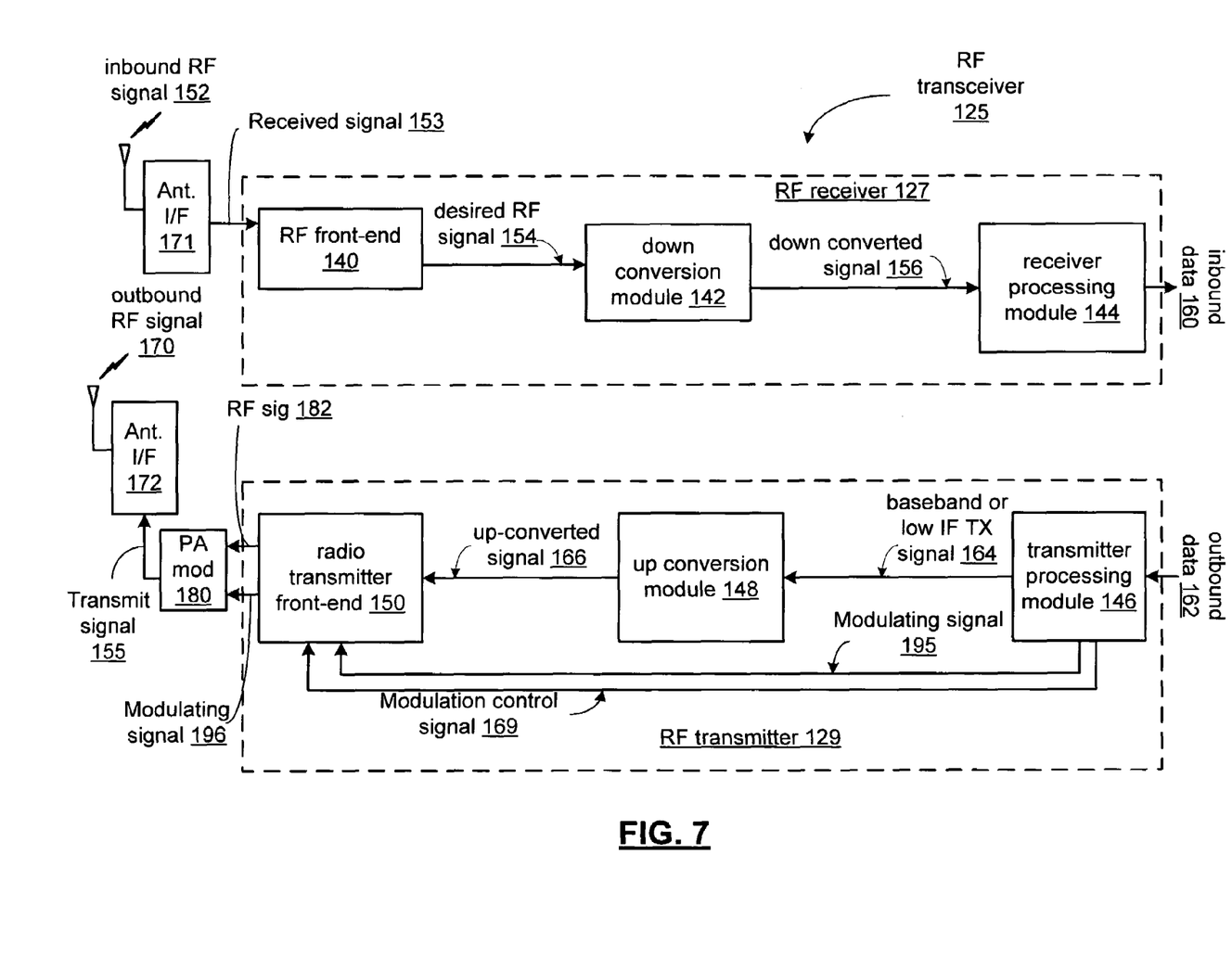
FIG. 7 is a schematic block diagram of another embodiment of a RF transceiver in accordance with the present invention.

FIG. 7 is a schematic block diagram of another embodiment of a RF transceiver in accordance with the present invention. In particular, an another embodiment of RF transceiver 125 is shown where similar elements are referred to by common reference numerals. As shown, power amplifier module 180 is coupled through an antenna interface 172 to a dedicated antenna or antenna system for transmitter 129. Similarly, RF receiver 127 receives inbound RF signal 152 through a dedicated antenna and antenna interface 171.

Figure 8:
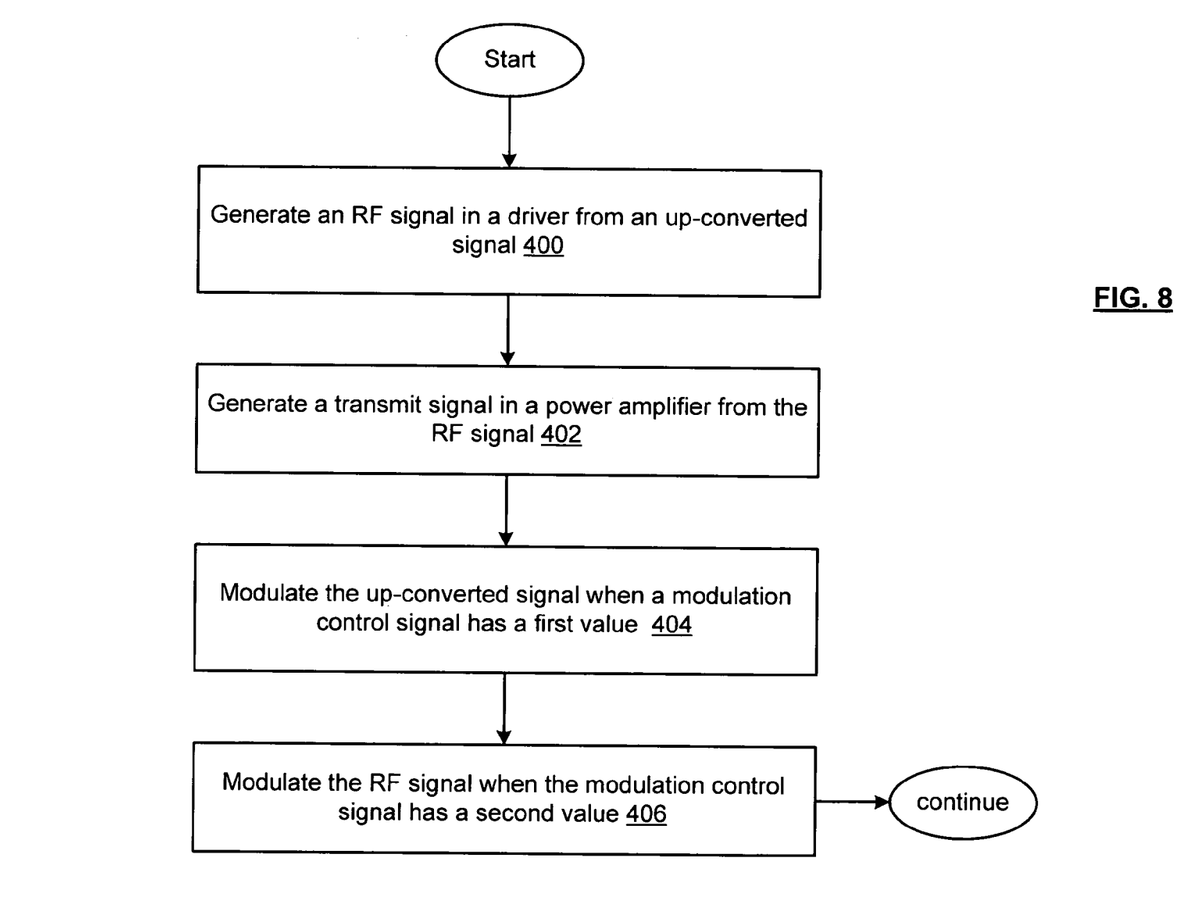
FIG. 8 is a flow chart of an embodiment of a method in accordance with the present invention.

FIG. 8 is a flow chart of an embodiment of a method in accordance with the present invention. In particular, a method is presented for use in conjunction with one or more of the functions and features described in conjunction with FIGS. 1-7. In step 400, an RF signal is generated in a driver from an up-converted signal. In step 402, a transmit signal is generated in a power amplifier module from the RF signal. In step 404, the up-converted signal is modulated when a modulation control signal has a first value. In step 406, the RF signal is modulated when the modulation control signal has a second value.

In an embodiment of the present invention, the transmit signal includes a polar coordinate transmission that is phase modulated and amplitude modulated. Step 404 can include amplitude modulating the up converted signal based on the first modulating signal when the modulation control signal has the first value. Step 406 can include amplitude modulating the RF signal based on the second modulating signal when the modulation control signal has the second value.

Figure 9:
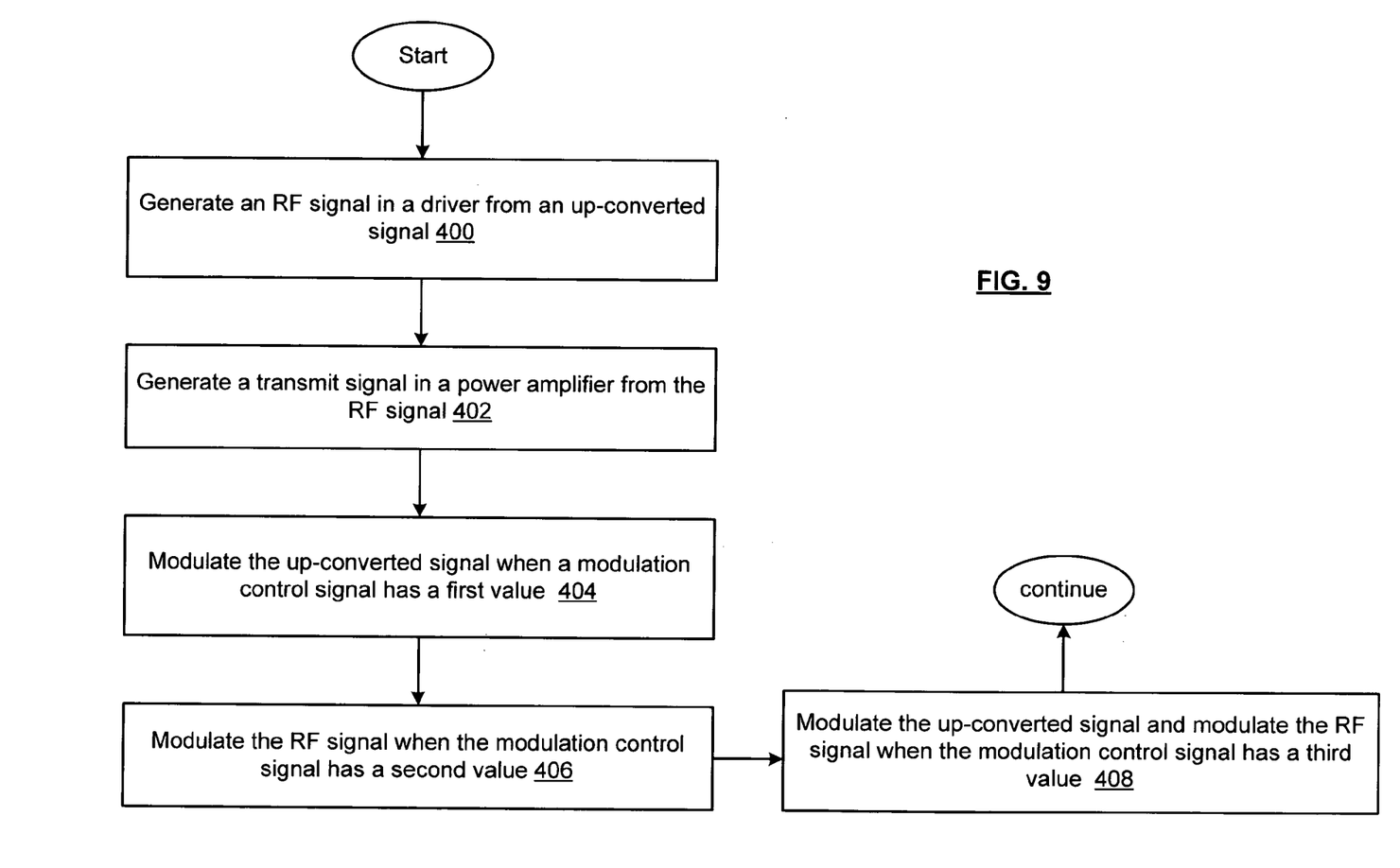
FIG. 9 is a flow chart of an embodiment of a method in accordance with the present invention.

FIG. 9 is a flow chart of an embodiment of a method in accordance with the present invention. In particular, a method is presented that includes many common elements of the method of FIG. 8 that are referred to by common reference elements. In addition, step 408 is included for amplitude modulating the up converted signal based on the first modulating signal and amplitude modulating the RF signal based on the second modulating signal, when the modulation control signal has a third value.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. While the term phase modulation is used herein it includes the equivalent frequency modulation.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A voice data and RF integrated circuit (IC) comprising:
    a driver, that generates an RF signal to a power amplifier module from an up-converted signal; and
    a modulation controller, coupled to the driver and to the power amplifier module that provides a first modulation signal to the driver for modulating the up-converted signal and for placing the power amplifier module in a non-modulation mode when a modulation control signal has a first value and that provides a second modulation signal to the power amplifier module for modulating the RF signal and for placing the driver in a non-modulation mode when the modulation control signal has a second value.

2. The voice data and RF IC of claim 1 wherein the power amplifier module is an off-chip power amplifier module.

3. The voice data and RF IC of claim 1 wherein the power amplifier module is an on-chip power amplifier module.

4. The voice data and RF IC of claim 1 wherein the power amplifier module generates a polar coordinate transmission that is phase modulated and amplitude modulated.

5. The voice data and RF IC of claim 1 wherein the driver amplitude modulates the up converted signal based on the first modulating signal when the modulation control signal has the first value.

6. The voice data and RF IC of claim 1 wherein the power amplifier module amplitude modulates the RF signal based on the second modulating signal when the modulation control signal has the second value.

7. The voice data and RF IC of claim 1 wherein the driver amplitude modulates the up converted signal based on the first modulating signal and the power amplifier module amplitude modulates the RF signal based on the second modulating signal when the modulation control signal has a third value.

8. The voice data and RF IC of claim 1 further comprising:
    a transmitter processing module for generating a third modulating signal based and a processed signal on outbound data; and
    an up conversion module, coupled to the transmitter processing module and the driver, that generates the up-converted signal based on the processed signal.

9. A radio frequency (RF) transmitter comprising:
a driver, that generates an RF signal from an up-converted signal;
a power amplifier module, coupled to the driver, that generates a transmit signal from the RF signal; and
a modulation controller, coupled to the driver and to the power amplifier module that provides a first modulation signal to the driver for modulating the up-converted signal and for placing the power amplifier module in a non-modulation mode when a modulation control signal has a first value and that provides a second modulation signal to the power amplifier module for modulating the RF signal and for placing the driver in a non-modulation mode when the modulation control signal has a second value.

10. The RF transmitter of claim 9 wherein the driver is implemented on an integrated circuit and the power amplifier module is an off-chip power amplifier module.

11. The RF transmitter of claim 9 wherein the power amplifier module and the driver are implemented on an integrated circuit.

12. The RF transmitter of claim 9 wherein the transmit signal includes a polar coordinate transmission that is phase modulated and amplitude modulated.

13. The RF transmitter of claim 9 wherein the driver amplitude modulates the up converted signal based on the first modulating signal when the modulation control signal has the first value.

14. The RF transmitter of claim 9 wherein the power amplifier module amplitude modulates the RF signal based on the second modulating signal when the modulation control signal has the second value.

15. The RF transmitter of claim 9 wherein the driver amplitude modulates the up converted signal based on the first modulating signal and the power amplifier module amplitude modulates the RF signal based on the second modulating signal when the modulation control signal has a third value.

16. The RF transmitter of claim 9 further comprising:
a transmitter processing module for generating a third modulating signal based and a processed signal on outbound data; and
an up conversion module, coupled to the transmitter processing module and the driver, that generates the up-converted signal based on the processed signal.

17. A method comprising:
generating an RF signal in a driver from an up-converted signal;
generating a transmit signal in a power amplifier module from the RF signal;
modulating the up-converted signal to generate the RF signal and amplifying the RF signal when a modulation control signal has a first value; and
amplifying the up-converted signal to generate the RF signal and modulating the RF signal when the modulation control signal has a second value.

18. The method of claim 17 wherein the transmit signal includes a polar coordinate transmission that is phase modulated and amplitude modulated.

19. The method of claim 17 wherein the step of modulating the up converted signal includes amplitude modulating the up converted signal based on the first modulating signal when the modulation control signal has the first value.

20. The method of claim 17 wherein the step of modulating the RF signal includes amplitude modulating the RF signal based on the second modulating signal when the modulation control signal has the second value.

21. The method of claim 17 further comprising:
when the modulation control signal has a third value, amplitude modulating the up converted signal based on the first modulating signal and amplitude modulating the RF signal based on the second modulating signal.

* * * * *